United States Patent [19]

Grill et al.

[11] 4,184,123
[45] Jan. 15, 1980

[54] DOUBLE-TUNED OUTPUT CIRCUIT FOR HIGH POWER DEVICES USING COAXIAL CAVITY RESONATORS

[75] Inventors: Gerald P. Grill, Ephrata; Claude E. Doner, New Providence, both of Pa.

[73] Assignee: RCA Corporation, New York, N.Y.

[21] Appl. No.: 834,268

[22] Filed: Sep. 19, 1977

[51] Int. Cl.² .......................... H03F 3/60; H01P 7/04
[52] U.S. Cl. ...................................... 330/56; 333/33; 333/226; 333/230
[58] Field of Search ............. 330/56; 333/82 R, 82 B; 331/96, 97, 98, 101

[56] References Cited

U.S. PATENT DOCUMENTS

| | | | |
|---|---|---|---|
| 2,220,922 | 11/1940 | Trevor | 325/489 X |
| 2,917,712 | 12/1959 | Smith et al. | 330/56 |
| 3,159,803 | 12/1964 | Czubiak et al. | 333/82 R X |
| 3,719,909 | 3/1973 | Hanft | 333/82 B X |

Primary Examiner—Paul L. Gensler
Attorney, Agent, or Firm—Eugene M. Whitacre; Paul J. Rasmussen; Robert L. Troike

[57] ABSTRACT

Coaxial, one-quarter wavelength resonant primary and secondary resonators are employed in conjunction with a tetrode tube to provide, for example, 55 Kw (kilowatts) of output power for VHF, high-band television broadcasting. Coupling between the two resonators is accomplished by connecting an inductance between the center conductors of the resonators. The effective inductance of this connection is varied (and thus the coupling of the resonator circuits is also varied) by the addition of a variable capacitor in series with the inductive connection.

9 Claims, 2 Drawing Figures

DOUBLE-TUNED OUTPUT CIRCUIT FOR HIGH POWER DEVICES USING COAXIAL CAVITY RESONATORS

BACKGROUND OF THE INVENTION

This invention relates to a double-tuned output circuit for a linear amplifier used for example in a very high frequency, high band, television transmitter and, more particularly, to a coaxial type primary resonator over-coupled to a secondary coaxial type resonator.

In a VHF television transmitter operating in the high band (174 to 216 MHz) it is necessary that the linear amplifier which is typically the final stage provide a power gain which is essentially constant over any selected six MHz channel.

In order to achieve this condition, it is essential that the output circuit of the amplifier have broad bandwidth. Adequate bandwidth can be obtained through the design of a double-tuned output circuit. Such output circuits at relatively high power output levels (approximately 3 Kw to 25 Kw at peak of sync) incorporate coaxial type primary and secondary circuits. These circuits typically operate in the one-quarter wavelength mode and are tuned to resonance by means of an adjustable shorting plunger between the coaxial elements. Coupling of the primary to the secondary circuit is typically accomplished by means of an adjustable coupling probe capacitor connected between the two circuits.

No great degree of difficulty is encountered achieving the desired coupling of primary and secondary circuits using this technique. At higher power levels (for example 55 Kw), using larger tubes, however, accomplishing capacitive coupling becomes extremely difficult due to larger tube output capacitance and consequently smaller size of the circuit required to resonate the higher tube output capacitance.

SUMMARY OF THE INVENTION

An output circuit for higher power active devices tunable over a broad band of frequencies is provided by primary and secondary coaxial cavity resonators over-coupled by an inductive coupling member. The primary cavity resonator is coupled across the output of the active device. The center conductor of the primary cavity resonator is coupled by an adjustable inductive coupling member to the center conductor of the secondary resonator.

DESCRIPTION OF THE INVENTION

A high band VHF television transmitter operates in the frequency range of 174 to 216 MHz (megahertz). Within that frequency range there are assigned seven television channels, namely, channels seven through thirteen. Each channel occupies a six MHz instantaneous bandwidth. For example, channel seven occupies the band from 174 to 180 MHz. Further information as to the frequency band occupied by each of the other channels can be obtained from ITT "Reference Data for Radio Engineers," Fourth Edition, Section 28, pages 9 and 10.

Figure 1:
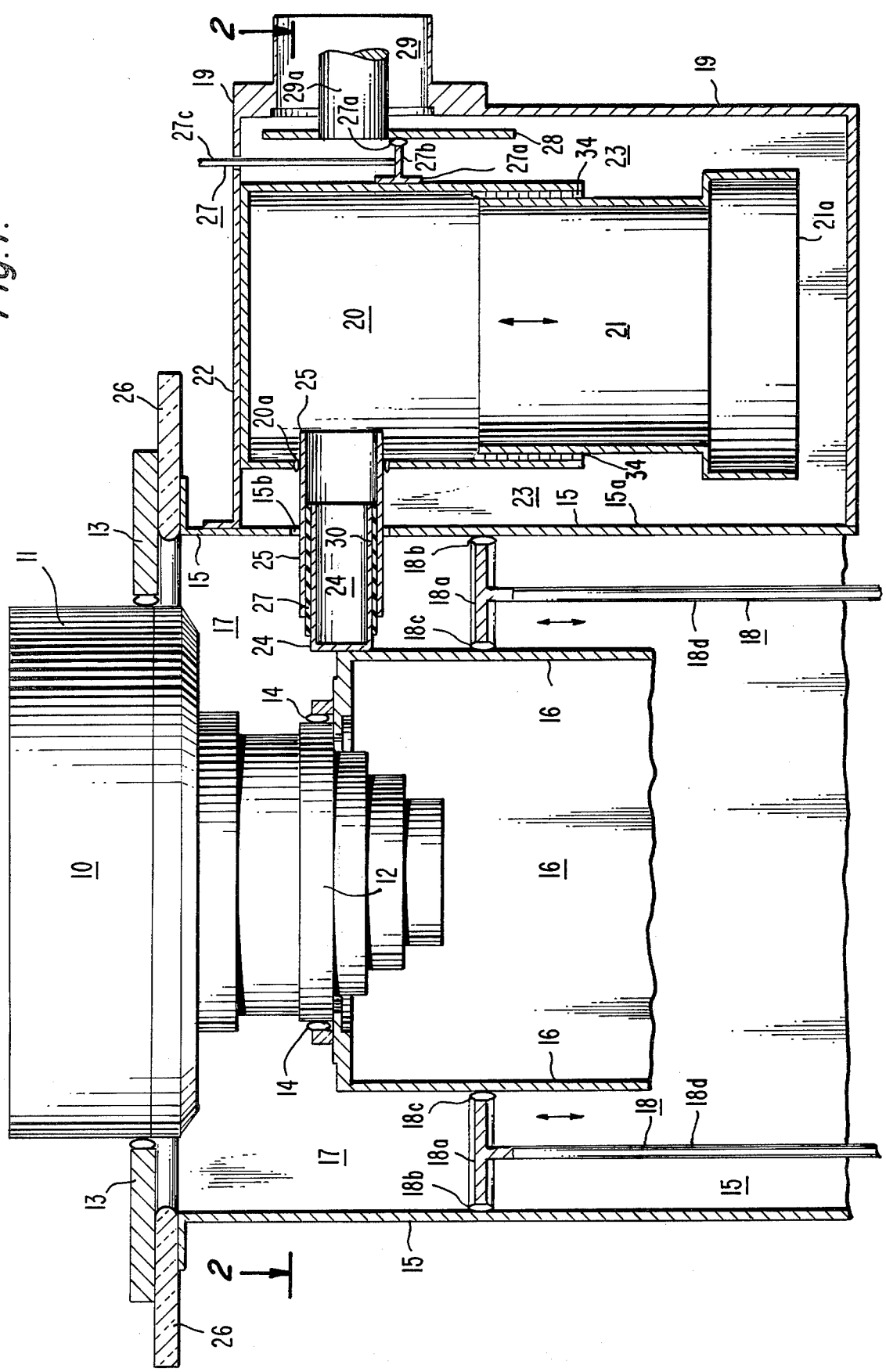
FIG. 1 is an elevation cross-sectional sketch of the double tuned output circuit using coaxial cavity resonators according to a preferred embodiment of the present invention.
Figure 2:
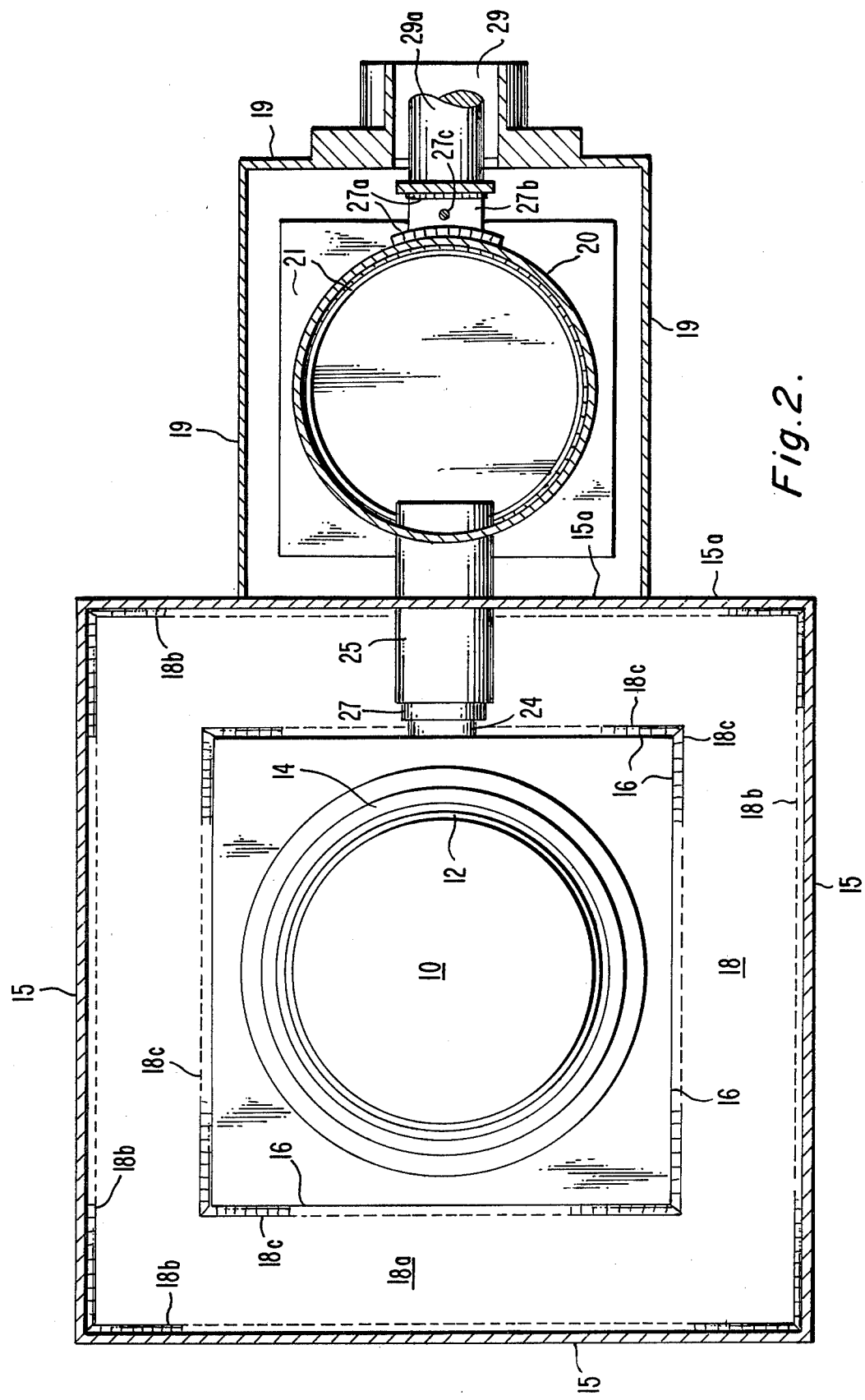
FIG. 2 is a cross-sectional sketch of the double tuned circuit taken along lines 2—2 of FIG. 1.

Referring to the FIGS. 1 and 2, there is shown cross-sectional sketches of the output circuit of a 55 Kw, high band VHF power amplifier. The output circuit transforms the 50 ohm load impedance to a higher value (approximately 600 ohms) at the active area of the tube. Amplifier gain is directly proportional to the magnitude of the transformed impedance and the output bandwidth is inversely proportional to this impedance. Therefore the circuit should be adjusted to obtain 6 MHz bandwidth since adjustment for greater bandwidth than needed will cause a loss of amplifier gain. In this embodiment, the power tube 10 is a tetrode RCA type 4690 (RCA Corporation, Lancaster, Pa.) represented by its plate 11 and screen grid 12 and the associated terminals in the form of metal contacts 13 and 14, respectively.

A hollow square shaft inner conductor 16 and a hollow square shaft concentric outer conductor 15 form a primary coaxial transmission line cavity resonator 17. This cavity resonator 17 is shorted at one end by metallic shorting plunger or member 18. The other end of this transmission line cavity resonator 17 is coupled across the tube 10 at contacts 13 and 14. The outer conductor 15 is coupled to the plate 11 via plate blocking capacitor 26 and metal contact 13 and the inner conductor 16 is coupled to screen grid 12 of the tube 10 through contact 14. Shorted transmission line cavity resonator 17 and the output capacitance (plate to screen grid capacitance) of the tube form a parallel resonant circuit. The shorting plunger 18 includes a square band 18a of conductive material that extends about the center conductor 16 with contact fingers 18b touching outer conductor 15, contact fingers 18c touching conductor 16 and rods 18d to permit the band 18a to slide up and down to tune the cavity. The overall length of the cavity resonator is adjusted to be with the tube 10 quarter wavelength resonant at the desired transmitter operating frequency.

A second coaxial transmission line cavity resonator 23 includes a hollow square shaft outer conductor comprising metallic member 19 (3 sides) and a portion 15a of the outer surface of conductor 15. The portion 15a is a common wall of the first and second cavities. The inner conductor of second transmission line cavity resonator 23 is formed by overlapping metallic cylindrical conductors 20 and 21 with metal contact fingers 34 therebetween. One end of this transmission line cavity 23 is shorted by fixed metallic member 22 connected between metallic conductor 20 and conductor 15 and member 19. This second transmission line cavity resonator 23 is terminated in an open circuit at the end 21a opposite the shorted end to form a one-quarter wavelength long resonant circuit (at a transmitter frequency) which is designated as the secondary tuned resonator. The inner conductor 21 near the open end 21a is wider and is square shaped to match the square outer conductor formed by members 19 and 15. A loading capacitance thereby is formed between inner conductor 21 and the members 19 and 15 near the end 21a to provide a foreshortened quarter wave resonator at a desired transmitter output frequency with a Q like that of the primary resonator circuit. The resonant frequency of this tuned circuit is adjusted by varying the overall length of the center conductor formed by telescoping electrically connected metallic members 20 and 21.

The primary and secondary tuned circuits (cavity resonators) are coupled to each other through telescoping metallic cylinders 24 and 25 extending in insulative manner through aperture 15b in wall 15a. Cylinder 24 is electrically connected to the center conductor 16 of the primary resonator. Cylinder 25 is electrically connected to the center conductor 20 of the secondary resonator through the use of finger contacts 20a as shown in FIG. 1. The two cylinders 24 and 25 are insulated from each other by a sleeve 27 of Teflon attached to cylinder 24. This combination forms a capacitor 30 whose value can be varied by moving cylinder 25 relative to fixed cylinder 24. Member 20 has a circular aperture therein with finger contacts 20a about the edge of the aperture. The finger contacts 20a in member 20 permit member 25 to move while maintaining electrical contact between the two. Electrically, this variable capacitor appears in series with the inductance formed by cylinders 24 and 25. In operation the net reactance of this coupling path is always inductive. Adjustment of the capacitor 30 serves to vary this effective inductance and thus vary the coupling between the two resonators. In the high power tubes such as 55 Kw, the capacity is larger than that of the lower power tubes (3 Kw to 25 Kw). Therefore, the external circuit to form the quarter wave resonant cavity with the tube is much smaller. Since the circuit is small, the coupling voltage is small and therefore conventional capacitive coupling is not practical. In accordance with the teaching herein inductive coupling provided by cylinders 24 and 25 is used for providing high current, low voltage coupling. The capacitance added in series decreases the value of inductance to properly over couple (properly exceed critical coupling) to get the double tuned response.

Referring to FIG. 1, it can be seen that the RF shorted end (at plunger 18) of the primary resonator 17 is toward the bottom of the figure relative to the open or tube end of the primary resonator. The secondary resonator 23, on the other hand, has its open end toward the bottom of the figure relative to its shorted end. This configuration permits the connection of the inductive coupling member to the center conductor of the secondary resonator at a low impedance point and further permits enough space for a radial type plate blocking capacitor 26. This capacitor 26 extends beyond the dimensions of the outer conductor 15 of the primary circuit without being obstructed by the secondary resonator 23.

In order to transform the 50 ohm load impedance to the proper value at the active area of the tube an adjustable loading control is provided. This control includes tuning plunger 27 having a metallic bar member 27b with contact fingers 27a and being movable by a dielectric rod 27c in the axial direction along the outer surface of the secondary resonator center conductor 20. As the plunger 27 is moved the fingers 27a maintain electrical contact between the center conductor 20 and a metallic strap 28 attached to the center conductor 29a of a 3⅛ inch output coaxial connector 29. Since the RF voltage across the secondary circuit transmission line varies from a maximum at the open end to zero at the shorted end, the impedance transformation between load and tube can be varied by this adjustable tap technique.

The range of the loading control provided by plunger 27 and the range of capacitance of the variable coupling capacitor 30 between cylinders 24 and 25 are chosen such that at all frequencies in the 174 to 216 MHz band the load to tube impedance transformation and the coupling between primary and secondary tuned resonators is adjusted to exceed critical coupling where the response curve of the double tuned output, therefore, exhibits the classic double peaks associated with overcoupling. In the above described arrangement for operating within the high VHF band, the square inner conductor 16 is about 8 inches (outside width) and the square outer conductor 15 is about 13 inches (inside width). The length (along lengthwise axis of the tube) of the primary resonator is from about 4 to 11 inches. In the secondary resonator, the inside width of the outer conductor from 15a to opposite wall 19, for example, is about 8 inches. The inner cylindrical conductor 20 is, for example 5½ inches (O.D.) and the inner cylindrical conductor 21 is about 5 inches (O.D.) with the square portion at end 21a being about 6 inches (O.D.). The length of the cavity resonator 23 from the shorted end to the open end 21a can vary from about 9 inches to about 14 inches. The cylinder 24 is about 1⅛ inches in diameter (O.D.) and about 3 inches long, and cylinder 25 is about 1 5/16 inches diameter (O.D.) and about 4 inches long.

What is claimed is:

1. A double tuned output circuit for a high power active device tunable over a given broad band of frequencies comprising:
    a primary coaxial cavity resonator having a center conductor coupled to a first terminal of said active device and a coaxial outer conductor coupled to a second terminal of said active device,
    a secondary coaxial cavity resonator having a center conductor and an outer conductor,
    and an adjustable inductive coupling device including an adjustable capacitor connected in series between the center conductors of said first and second resonators for, by adjustment of said series connected capacitor, adjusting the coupling between the primary and secondary resonators to exceed the desired critical coupling to achieve the desired broad band response.

2. The combination of claim 1 wherein said primary cavity resonator with said active device is a quarter wavelength resonant to one of said frequencies within said band and includes frequency adjustable means remote from said active device for shorting said center conductor to said outer conductor of said primary cavity resonator to tune said cavity.

3. The combination of claim 2 wherein said secondary cavity resonator is a quarter wavelength resonant at a given frequency within said broad band of frequencies.

4. The combination of claim 3 wherein said inner and outer conductors of said secondary cavity resonator are shorted near the coupled end of said cavity and the center conductor is unconnected at the opposite end and wherein said secondary cavity resonator includes tuning means remote from the shorted end for adjusting the resonance of said secondary cavity resonator.

5. The combination of claim 4 wherein said secondary cavity resonator tuning means includes means for varying the length of the center conductor.

6. A double tuned output circuit for a high power active device tunable over a given broad band of frequencies comprising:
    a primary coaxial cavity resonator having a center conductor coupled to a first terminal of said active device and a coaxial outer conductor coupled to a second terminal of said active device, said primary cavity resonator with said active device is a quarter wavelength resonant at one of said frequencies within said band and includes frequency adjustable means remote from said active device for shorting said center conductor to said outer conductor of said primary cavity resonator to tune said cavity, a secondary coaxial cavity resonator having a center conductor and an outer conductor, said secondary cavity resonator being a quarter wavelength resonant at a given frequency within said broad band of frequencies, said inner and outer conductors of said secondary cavity resonator are shorted near the coupled end of said cavity and the center conductor is unconnected at the opposite end and wherein said secondary cavity resonator includes tuning means remote from the shorted end for adjusting the resonance of said secondary cavity resonator, said secondary cavity resonator tuning means includes means for varying the length of the center conductor, an adjustable inductive coupling means connected between the center conductors of said first and second resonators for adjusting the coupling between the primary and secondary resonators to exceed the desired critical coupling to achieve the desired broad band response, and output coupling means including an output coaxial connector having a center conductor and a conductive member extending therefrom parallel to the center conductor of said secondary resonator and an output conductive coupling member connected between said center conductor of said secondary resonator and said conductive member, said output conductive coupling member being slidable along said center conductor of said secondary cavity resonator toward and away from the shorted end to adjust impedance transformation between the active device and the connector.

7. The combination of claim 6 wherein said adjustable inductive coupling means extends through a common wall of said primary and secondary resonators.

8. The combination of claim 7 wherein said active device is a tube.

9. The combination of claim 8 wherein said tube is a tetrode and said first terminal is the screen grid and said second terminal is the plate.

* * * * *